METHOD OF MAKING A SEMICONDUCTOR DEVICE INCLUDING A POLYIMIDE RESIST FILM

Filed April 8, 1970

INVENTOR
Robert N. Epifano
Eugene L. Jordan
BY W. S. Hill
Agent

United States Patent Office 3,700,497

Patented Oct. 24, 1972

3,700,497

METHOD OF MAKING A SEMICONDUCTOR DEVICE INCLUDING A POLYIMIDE RESIST FILM

Robert Nicholas Epifano, Oceanport, and Eugene Leon Jordan, Piscataway, N.J., assignors to RCA Corporation Original application Sept. 15, 1967, Ser. No. 668,080. Divided and this application Apr. 8, 1970, Ser. No. 26,806

Int. Cl. B44d *1/18, 1/52, 1/10*

U.S. Cl. 117—212 6 Claims

ABSTRACT OF THE DISCLOSURE

Method of manufacturing a semiconductor device or integrated circuit which includes using a masking film composed of a thermoplastic type polyimide synthetic resin. The resin film is deposited either directly on the semiconductor body or on a passivating film of a substance such as silicon dioxide or silicon nitride, while the resin is in an incompletely cured (incompletely polymerized) state. Openings are etched through the film while it is in this state. Then the film is completely cured. After the resin film is completely cured it may be subjected to relatively high temperatures and to most solvents, as may be required in later device processing steps, without damage to the resin film.

CROSS-REFERENCE TO RELATED APPLICATIONS

This application is a division of application Ser. No. 668,080, filed Sept. 15, 1967 and now abandoned.

BACKGROUND OF THE INVENTION

The present invention relates to methods using an improved resist film.

In the manufacture of articles such as semiconductor devices, or microminiature circuits including semiconductor devices, it is frequently necessary to utilize masking films or layers into which openings are fabricated for particular purposes. It is often desirable that the masking film have such properties as resistance to common organic solvents, resistance to various acids and alkalies, stability at relatively high temperatures, and resistance to scratching and abrasion. It is further frequently desirable that the masking film have good adherence to substrate materials and be capable of being put down in a thin layer without having discontinuities, such as pinholes, inadvertently formed therein.

A particular application in which masking films have been used is that of manufacturing microminiature silicon monolithic circuits. In manufacturing this type of article, circuit components are formed in a body of semiconducting material such as silicon and a protective layer such as silicon dioxide is formed over the circuit area. Connections are made to the circuit components, and sometimes between circuit components, by depositing evaporated conductive films such as aluminum. In order to define the places where the aluminum film is to be connected to external parts or to other circuits, photoresists have been used to define openings into which metal is deposited to make electrical connection to the aluminum. However, the use of conventional photoresists for this purpose has been found to be unsatisfactory for a number of reasons. Conventional photoresists are not resistant to many organic solvents. The photoresists are also attacked, to a certain extent, by acids which are desirable to use in etching through a silicon oxide film, and all conventional photoresists are adversely affected and even destroyed completely by moderately high temperatures which one would like to use to process silicon monolithic circuits in such operations as making soldered connections to the circuit.

It has further been found that thin films of photoresist are subject to the inadvertent formation of pinholes, so that later treatment with evaporated or molten metals or other evaporated substances causes penetration of these substances at the pinholes to undesired parts of the circuit. Photoresists are also subject to damage by scratching and abrasion.

OBJECT OF THE INVENTION

It is an object of the invention to provide an improved method of manufacturing an article which includes application of a resist film capable of accurate definition by photoresist methods but which is highly resistant to scratching and formation of pinholes.

SUMMARY OF THE INVENTION

The present invention, in one of its modifications, comprises a method of manufacturing an article which includes a body of semiconductor material, a layer of cured polyimide synthetic resin over at least part of the semiconductor body surface, at least one opening through the polyimide layer, and a quantity of solder within the opening making electrical contact to the surface.

One aspect of the method of the present invention comprises providing a semiconductor body having a surface, covering at least a part of the surface with a layer of partially-cured polyimide resin, forming one or more openings through the resin layer to the body surface, completely curing the resin layer, and depositing a metal such as molten solder within the opening. In a modification of the method, the semiconductor body may be first covered with a passivating layer such as silicon oxide or silicon nitride before depositing the partially cured resin layer, and more than one resin layer may be deposited.

THE DRAWINGS

PREFERRED EMBODIMENTS

Figures 1, 2, 3, 4, 5, 6:
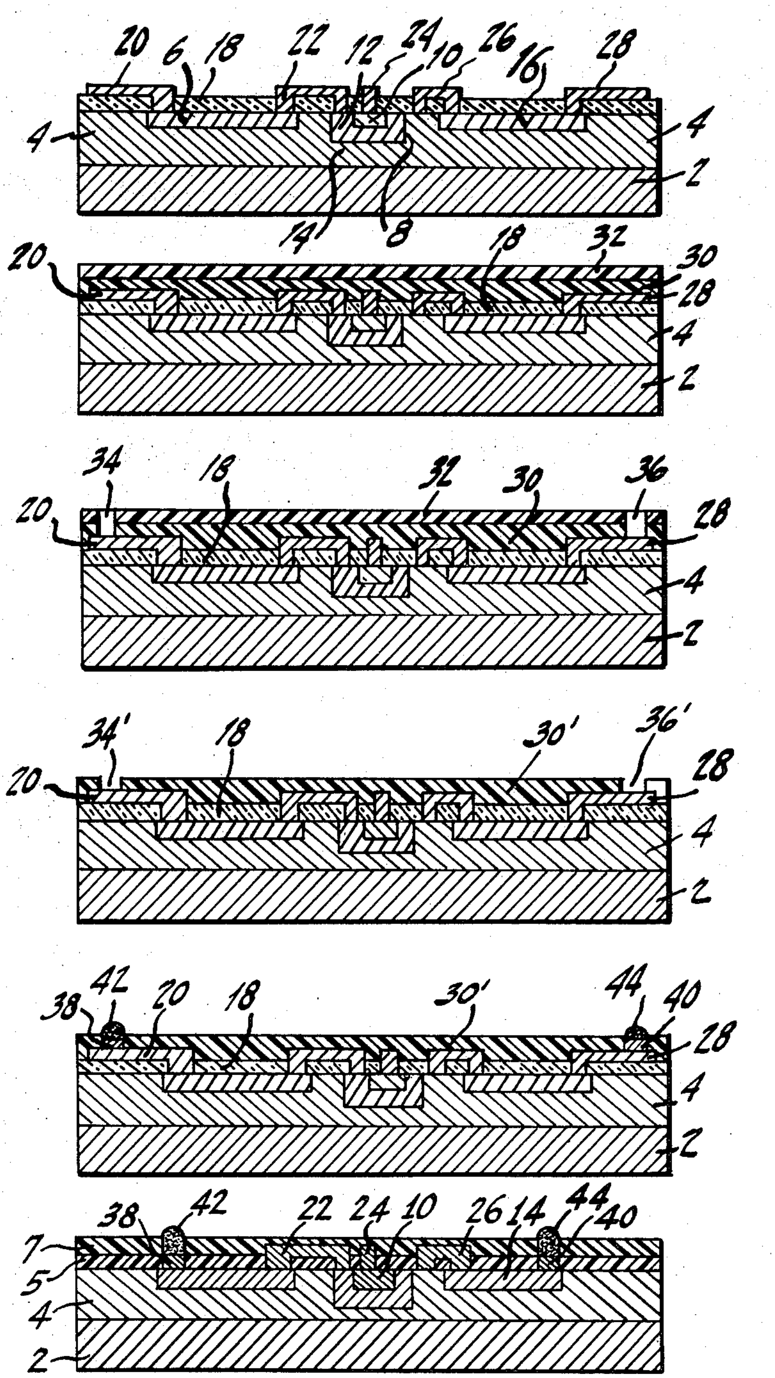
FIG. 1 is a cross-section view of a typical portion of a silicon monolithic miniature circuit of the type having active and passive circuit elements formed by diffusion of impurities into a surface of a semiconductor body, in an early stage of manufacture in accordance with the present invention.
FIGS. 2, 3, 4 and 5 are views similar to that of FIG. 1 showing the circuit in successive states of manufacture.
FIG. 6 is a cross-section view of a typical portion of a silicon monolithic circuit in accordance with another embodiment of the invention.

The invention will be described using as illustration a method of making soldered electrical connections to predetermined locations on a microminiature silicon monolithic circuit, but it will be understood that the article and method can be more broadly applied.

Referring now to FIG. 1, there is illustrated, in cross-section view, a part of a typical silicon monolithic circuit comprising a substrate 2 of single crystal silicon of N+ conductivity type, a layer 4 of single crystal silicon of N conductivity type epitaxially grown on the layer 2, and certain circuit components formed in the epitaxial layer. The circuit components comprise a resistor 6 formed by diffusing P type impurities into the epitaxial layer 4, a transistor 8 which includes an N type emitter region 10, a P type base region 12, and a collector region 14, the emitter and base regions having been formed by diffusion of proper conductivity type impurities into the top surface of the epitaxial layer 4. Also illustrated is another resistor 16 formed by diffusion of P type impurities into the epitaxial layer 4. These circuit components are given only by way of illustration and are not intended to be limiting in the present invention.

The circuit components and substantially all of the top surface of the epitaxial layer 4 are covered with a protective layer 18 of silicon dioxide grown on or deposited on the layer 4 by any conventional means.

The circuit also includes electrical connections to the components made by depositing evaporated aluminum onto the silicon dioxide layer and through suitable openings in the silicon dioxide layer to the components. In the drawing one of these connections is shown as a connection 20 which overlies a part of the silicon dioxide layer and extends through the layer to one end of the resistor 6. Another connection 22 extends through the silicon dioxide layer to the opposite end of the resistor 6 and also connects to the base region 12 of the transistor 8. A metal connection 24 also extends through the silicon dioxide layer to the emitter region 10 of the transistor 8. Another connection 26 connects the collector layer of the transistor 8 to one end of the resistor 16. Another connection 28 connects to the opposite end of the resistor 16 and extends over part of the silicon dioxide layer 18 to an edge of the circuit.

One of the most costly items in the manufacture of this type of circuit in the past has been making connections to certain parts of the circuit so that the circuit can be connected to other circuits or other external appartus. In the past this has generally been done by an operator making individually soldered connections to each point and attaching to these points thin wires which extended to external bonding pads. It is highly desirable that this type of operation be replaced with a method which permits making all of the connections simultaneously and which is more adaptable to automatic machine-assisted fabrication.

In the type of circuit illustrated, it is usually desirable to make soldered connections to those connecting parts designated as 20 and 28 in the drawing, these parts being illustrations of bonding portions usually connected by wires to external bonding pads. As illustrated in FIG. 2, a thin layer 30 of polyimide resin in an incompletely polymerized state is deposited over the silicon dioxide layer 18 and the metal connections 20, 22, 24, 26, and 28. The polyimide resin is one which has thermoplastic properties rather than the thermosetting properties and may be one such as that designated by RK–692 manufactured by the duPont Company. This resin has the structural configuration

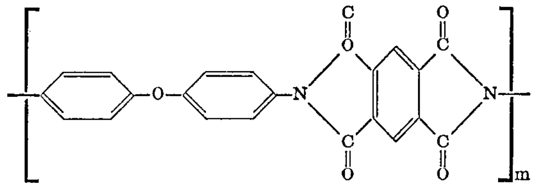

It may be applied by making up a solution of the uncured resin in dimethyl acetamide. The solution may preferably contain 12 to 18% of the resin by weight are permitted. The coating is applied by using a photoresist whirler capable of 4000 r.p.m. The layer preferably has a thickness of about 12000 A. and a range of thickness between 6000 and 22000 A. The thickness of the layer which is applied by this spin-coating method depends largely on the concentration of the resin solution and also on the speed of the whirler. Usually, the more concentrated the solution, the thicker the layer which is applied by this method. After the coating is applied, it is dried at 180° F. for 3 minutes to drive off the solvent.

Next a layer of photoresist 32 is applied over the polyimide layer. This can be any conventional photoresist such as AZ111 marketed by the Shipley Company. The photoresist is applied by flooding the surface of the polyimide layer with the photoresist solution and whirling at 4000 r.p.m. for one minute. The assembly is then baked at 180° F. for 15 minutes. The layer of photoresist is about 5000 A. in thickness.

A positive masking pattern is then placed on top of the layer of baked photoresist and the pattern is exposed, using ultra violet light, for a few seconds. After exposure is complete, the photoresist is developed with a dilute organic or inorganic base solution and this removes the parts of the film which were exposed to ultraviolet light and also the parts of the polyimide layer 30 directly beneath the removed parts of the photoresist layer 32. In FIG. 3, the opened-up portions are shown as openings 34 and 36, extending through both the photoresist layer 32 and the underlying polyimide layer 30. The opening 34 extends to the metal connecting layer 20, and the opening 36 extends to the metal connecting layer 28.

The next stage in the process is to remove the photoresist. This may be done by dissolving it in acetone (for the Shipley photoresist specified). The acetone does not attack the polyimide resin even in its incompletely cured state.

The last step is to cure the polyimide resin completely. This may be done by first baking it on a hot plate at 180° F. for 3 minutes; then in a 400° F. oven for two hours, and finally in a 750° F. oven for ten minutes. The resin may be cured by baking at lower temperatures for longer periods of time. The 750° F. temperature specified is preferred.

Referring to FIG. 4, the circuit has openings 34' and 36' extending to the connectors 20 and 28, respectively, through the cured polyimide layer 30'.

It is desired to make electrical connections through the openings 34' and 36' to the aluminum connectors 20 and 28 in a manner that involves a minimum amount of operator time, in order to reduce the cost of mounting this type of circuit and connecting it to other parts of a system. This may be done by depositing layers 38 and 40 of nickel within the openings 34' and 36', respectively, and then dipping the entire assembly in a bath of molten lead-tin solder to deposit "bumps" 42 and 44 of solder on the nickel layers 38 and 40. The solder adheres only to those parts of the assembly having a nickel surface. The nickel may be deposited by conventional means such as masking and evaporation. One of the principal advantages of the invention is apparent in the solder deposition process. The polyimide resin coating 30' is unaffected by the temperatures of the solder bath, and the polyimide coating, although very thin, will be sufficiently free of pinholes so that solder will not penetrate through the masking layer 30' in places other than where openings have been intentionally prepared.

An article such as shown in FIG. 5 can now be inverted and accurately positioned on a mounting spider with each soldered bump accurately placed over a corresponding metal bonding pad and, by application of temperature just high enough to melt the solder, the entire circuit can be soldered in one step to the mounting spider.

Results similar to those which have been described above have also been obtained with polymide resins having the structure

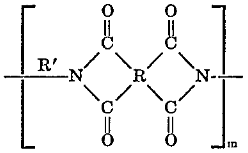

In this structural formula R and R' stand for alkyl or aryl radicals. The alkyl radicals are preferably simple radicals, such as methyl or ethyl and the aryl radicals are preferably benzene rings. The

groups attach to the ends of the alkyl radicals. Procedure in using this type of resin is nearly the same as in using the type previously described. The uncured polyimide resin can be purchased under the trade description PI-1100 from the Du Pont Company. A solution of the resin can be made up from one part of dimethylacetamide to three parts of the resin, as purchased, by volume. After the photoresist has been removed as in the previous example, the resin can be cured by baking in a 400° F. oven for two hours. Better adhesion to a silicon dioxide substrate has been obtained by baking for ten minutes at 750° F. in a nitrogen atmosphere.

Although silicon dioxide has been described in the examples as desirable passivating film to be used where silicon is the semiconductor material, silicon nitride can also be used for this purpose. And where other semiconductor materials are used, other passivating films can be used.

In another embodiment of the invention, illustrated in FIG. 6, the epitaxial layer 4 (e.g., silicon) is covered with a first layer 5 of cured polyimide synthetic resin, metallic connections 22, 24 and 26 extend through and over this layer, and the first resin layer and metal connections are covered with a second layer 7 of cured polyimide synthetic resin. One or more openings may extend through both layers to the semiconductor body surface such that nickel films 38 and 40 may be deposited on the semiconductor, and solder bumps 42 and 44 may be deposited on the nickel as previously described.

The resin layers are deposited in a partially-cured state as described above and then, after openings have been formed in the layers, they are completely cured. The metal connections 22, 24 and 26 are deposited after the first layer 5 has been completely cured.

In this modification the usual passivating layer of silicon dioxide or silicon nitride is eliminated.

Although, in the examples described, a type of photoresist has been described which becomes more soluble when exposed to light, the invention is also applicable to the type of photoresist that becomes less soluble when exposed to light.

What is claimed is:

1. A method of making a semiconductor device comprising:

(a) providing a semiconductor body having a surface,
(b) covering at least part of said surface with a layer of silicon dioxide or silicon nitride,
(c) depositing films of metal, as circuit interconnections on said layer of silicon dioxide or silicon nitride,
(d) covering said metal films and said layer of silicon dioxide or silicon nitride with a layer of partially-cured polyimide resin,
(e) covering said layer of resin with a layer of a photoresist,
(f) exposing said photoresist with a masking pattern which defines positions where openings through said polyimide layer are desired, (g) removing said photoresist and underlying polyimide at said positions to provide said openings,
(h) removing the remaining portions of said photoresist, and
(i) curing the remainder of said polyimide layer by heating at a temperature of 400°-750° F. for from 2 hours to about 10 minutes.

2. A method according to claim 1 including depositing solder within said openings.

3. A method of making a semiconductor device comprising:

(a) providing a semiconductor body having a surface,
(b) covering at least a part of said surface with a first layer of partially-cured polyimide resin,
(c) forming openings through said resin layer to said surface,
(d) curing said resin layer,
(e) depositing a defined metal film pattern on said cured resin layer,
(f) depositing a second layer of partially-cured polyimide resin over said first resin layer and said metal film,
(g) forming additional openings through said second resin layer, and
(h) curing said second resin layer.

4. A method according to claim 3 including a further step of depositing metal at least within said additional openings.

5. A method of making a semiconductor device comprising:

(a) providing a semiconductor body having a surface,
(b) covering at least a part of said surface with a layer of partially-cured polyimide resin,
(c) forming at least one opening through said resin layer to said surface,
(d) curing said resin layer, and
(e) depositing a metal within said opening.

6. A method according to claim 5 in which said metal is molten solder.

References Cited

UNITED STATES PATENTS

| | | | |
|---|---|---|---|
| 3,366,519 | 1/1968 | Pritchard, Jr. et al. | 96—36.2 X |
| 3,179,634 | 4/1965 | Edwards et al. | 117—128.4 X |
| 3,545,076 | 12/1970 | Schulten | 117—212 X |
| 3,486,934 | 12/1969 | Bond et al. | 117—218 |
| 3,515,585 | 6/1970 | Chamberlin et al. | 117—212 |
| 3,542,551 | 11/1970 | Rice | 96—36.2 |
| 3,554,984 | 1/1971 | George | 117—218 X |

RALPH S. KENDALL, Primary Examiner

K. P. GLYNN, Assistant Examiner

U.S. Cl. X.R.

29—578; 117—5.5, 218; 156—17

UNITED STATES PATENT OFFICE
CERTIFICATE OF CORRECTION

Patent No. 3,700,497 Dated October 24, 1972

Inventor(s) Robert Nicholas Epifano & Eugene Leon Jordan

It is certified that error appears in the above-identified patent and that said Letters Patent are hereby corrected as shown below:

Col. 3, the formula following line 50 should be:

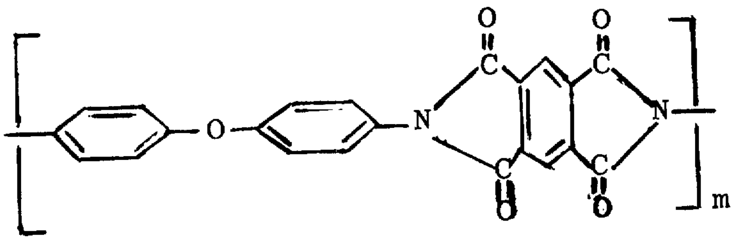

Col. 3, line 61, after "weight" insert -- , although concentrations of 6 to 45% by weight --.

Signed and sealed this 6th day of March 1973.

(SEAL)
Attest:

EDWARD M.FLETCHER,JR.
Attesting Officer

ROBERT GOTTSCHALK
Commissioner of Patents

FORM PO-1050 (10-69)

USCOMM-DC 60376-P69
☆ U.S. GOVERNMENT PRINTING OFFICE : 1969 O—366-334